US012096705B2

(12) United States Patent
Mitkova et al.

(10) Patent No.: US 12,096,705 B2
(45) Date of Patent: Sep. 17, 2024

(54) CONDUCTIVE BRIDGE RANDOM ACCESS MEMORY DEVICES BASED ON NANOTUBE CHALCOGENIDE GLASS STRUCTURES

(71) Applicant: BOISE STATE UNIVERSITY, Boise, ID (US)

(72) Inventors: Maria Mitkova, Boise, ID (US); Muhammad Rizwan Latif, Pocatello, ID (US)

(73) Assignee: Bosie State University, Boise, ID (US)

( * ) Notice: Subject to any disclaimer, the term of this patent is extended or adjusted under 35 U.S.C. 154(b) by 509 days.

(21) Appl. No.: 17/111,377

(22) Filed: Dec. 3, 2020

(65) Prior Publication Data

US 2021/0167284 A1 Jun. 3, 2021

Related U.S. Application Data

(60) Provisional application No. 62/943,018, filed on Dec. 3, 2019, provisional application No. 62/943,008, filed on Dec. 3, 2019.

(51) Int. Cl.
*H10N 70/00* (2023.01)
*H10B 63/00* (2023.01)

(52) U.S. Cl.
CPC ......... *H10N 70/823* (2023.02); *H10B 63/00* (2023.02); *H10N 70/021* (2023.02); *H10N 70/8265* (2023.02); *H10N 70/841* (2023.02); *H10N 70/8825* (2023.02)

(58) Field of Classification Search
CPC .................................... H10N 70/826
See application file for complete search history.

(56) References Cited

U.S. PATENT DOCUMENTS

2010/0006813 A1* 1/2010 Xi ............... H10N 70/8825
257/E47.001

* cited by examiner

*Primary Examiner* — Moazzam Hossain
*Assistant Examiner* — Hajar Kolahdouzan
(74) *Attorney, Agent, or Firm* — Parsons Behle & Latimer

(57) ABSTRACT

A memory cell may include an active electrode, an inert electrode, and a dielectric positioned between them. A forward electrical bias between the electrodes may result in the formation of a conductive bridge between them. A reverse electrical bias may result in the dissolution of the conductive bridge. The memory cell may include nanotube structures formed within the dielectric, where the nanotube structures define columns between the active electrode and the inert electrode. A memory device may include multiple such conductive bridge memory cells. A method of forming a memory cell may include positioning an active electrode onto a substrate, positioning a dielectric layer onto the active electrode, forming nanotube structures within the dielectric layer while positioning the dielectric layer, where the nanotube structures define columns within the dielectric layer, and positioning an inert electrode onto the dielectric layer.

12 Claims, 3 Drawing Sheets

CONDUCTIVE BRIDGE RANDOM ACCESS MEMORY DEVICES BASED ON NANOTUBE CHALCOGENIDE GLASS STRUCTURES

CROSS-REFERENCE TO RELATED APPLICATIONS

This application claims priority to, and the benefit of, U.S. Provisional Patent Application No. 62/943,008, filed on Dec. 3, 2019, and entitled "Nanotube Structures, Material Characterization and Structural Analysis of Ge—Se Thin Films," and U.S. Provisional Patent Application No. 62/943,018, filed on Dec. 3, 2019, and entitled "CBRAM Devices Based on Nanotube Chalcogenide Glass Structure," the contents of each of which are incorporated by reference herein in their entirety.

FIELD OF THE DISCLOSURE

This disclosure is generally related to the field of random-access memory (RAM) and, in particular, to conductive bridge RAM (CBRAM).

BACKGROUND

Memory plays an important role in today's electronics market. All modern electronic products have memory either embedded within the device or attached externally. Advancements in personal electronic devices have resulted in a dramatic increase in the demand for non-volatile memory. An example of non-volatile memory is flash memory. Not-And (NAND) flash memory may have a sufficiently high density for many applications. However, as smaller-sized memory cells become more important flash memory cells may be too large and too difficult to scale down for other applications.

Other types of memory devices, such as phase change memory devices, may be scalable to smaller sizes than flash memory. However, large transistors are typically used to provide a sufficient current to register a phase change within the memory cell. The large transistors may offset the size-savings associated with phase change memory devices. One solution may be found in CBRAM devices, which are a recently developed type of memory that may rely on lower switching currents while also being capable of scaling to a smaller size than flash memory. CBRAM devices may use ions from an electrochemically active anode to construct a redox conductive bridge in the presence of a forward-biased set voltage. The conductive bridge may be dissolved in response to a reverse-biased reset voltage. A lower read current may be used to determine the setting of the cell.

Generally, the solid-state electrolyte or other material used between the electrodes in CBRAM devices is amorphous. Thus, bridge formation, may become stochastic, resulting in three-dimensional random growth. Multiple branches may form, some of which do not connect the electrodes during the ON state of the device. This three-dimensional growth may result in lower switching efficiency because the bridge may have multiple unconnected branches and a meandering shape. Further, because more ions are taken from the active anode, these CBRAM devices may degrade quickly compared to flash memory. Other disadvantages may exist.

SUMMARY

Disclosed is a CBRAM device that overcomes one or more of the disadvantages associated with typical CBRAM devices. In an embodiment, a conductive bridge memory cell includes an electrochemically active electrode and an electrochemically inert electrode. The conductive bridge memory cell further includes a dielectric positioned between the active electrode and the inert electrode, where a forward electrical bias between the active electrode and the inert electrode results in the formation of a conductive bridge between the active electrode and the inert electrode, and where a reverse electrical bias results in the dissolution of the conductive bridge. The conductive bridge memory cell further includes nanotube structures formed within the dielectric, where the nanotube structures define columns between the active electrode and the inert electrode.

In some embodiments, the columns confine growth of the conductive bridge between the nanotube structures. In some embodiments, the active electrode includes an anode comprising silver, copper, or a combination thereof. In some embodiments, the inert electrode includes a cathode comprising platinum, tungsten, nickel, or a combination thereof. In some embodiments, the dielectric includes a chalcogenide glass from the entire family of chalcogenide glasses. In some embodiments, the chalcogenide glass includes materials from the Ge—Se glass system. In some embodiments, a resistance between the active electrode and the inert electrode is less when the conductive bridge is present than when the conductive bridge is not present.

In an embodiment, a method of forming a conductive bridge memory cell includes positioning an electrochemically active electrode onto a substrate. The method further includes positioning a dielectric layer onto the electrochemically active electrode. The method also includes forming nanotube structures within the dielectric layer while positioning the dielectric layer, where the nanotube structures define columns within the dielectric layer. The method includes positioning an electrochemically inert electrode onto the dielectric layer.

In some embodiments, a forward electrical bias between the active electrode and the inert electrode results in the formation of a conductive bridge between the active electrode and the inert electrode, a reverse electrical bias results in the dissolution of the conductive bridge, and the columns confine growth of the conductive bridge between the nanotube structures. In some embodiments, positioning the dielectric comprises thermally evaporating films of Ge—Se chalcogenide glass on the substrate. In some embodiments, forming the nanotube structures within the dielectric layer comprises tilting the substrate relative to a vapor flux direction while positioning the dielectric layer. In some embodiments, the active electrode includes an anode comprising silver, copper, or a combination thereof. In some embodiments, the inert electrode includes a cathode comprising platinum, tungsten, nickel, or a combination thereof. In some embodiments, the dielectric includes a chalcogenide glass. In some embodiments, the chalcogenide glass includes materials from the Ge—Se glass system.

In an embodiment, a memory device includes multiple conductive bridge memory cells, where each conductive bridge memory cell includes an electrochemically active electrode and an electrochemically inert electrode. Each conductive bridge memory cell further includes a dielectric positioned between the active electrode and the inert electrode, where a forward electrical bias between the active electrode and the inert electrode results in the formation of a conductive bridge between the active electrode and the inert electrode, and where a reverse electrical bias results in the dissolution of the conductive bridge. Each conductive bridge memory cell also includes nanotube structures formed within the dielectric, where the nanotubes define columns between the active electrode and the inert electrode.

In some embodiments, the active electrode includes an anode comprising silver, copper, or a combination thereof. In some embodiments, the inert electrode includes a cathode comprising platinum, tungsten, nickel, or a combination thereof. In some embodiments, the dielectric includes a chalcogenide glass. In some embodiments, the chalcogenide glass includes materials from the Ge—Se glass system.

Figure 1A:
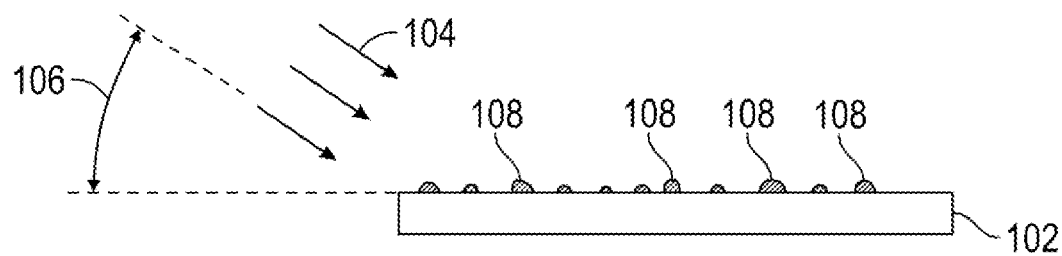
FIGS. 1A-1C are a series of cross-section views depicting growth of nanotube structures on a substrate.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Figure 1B:
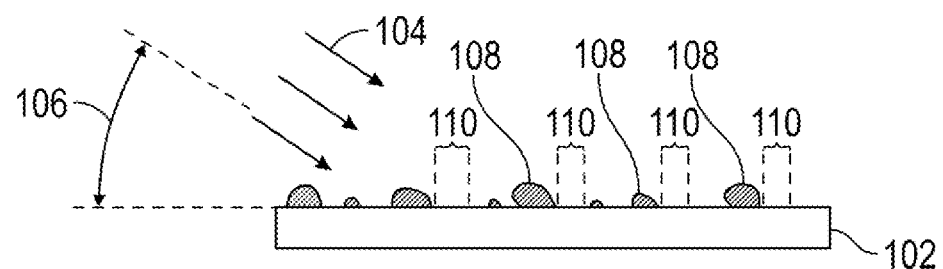
Figure 1C:
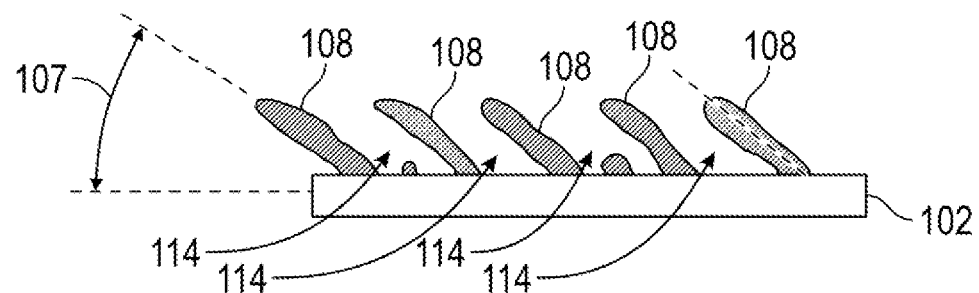

Referring to FIGS. 1A-1C, the growth of chalcogenide glass columns 112 is depicted. The chalcogenide glass columns 112 may be used to restrict the direction in which conductive bridges may grow within the chalcogenide glass layer as described herein. For example, conductive bridges that form within the chalcogenide glass material, as described further herein, may be confined to the chalcogenide glass columns 112, thereby restricting the directions in which the conductive bridges may grow.

Referring to FIG. 1A, a physical vapor deposition (PVD) process may be applied to a substrate 102. During the PVD process, a vapor flux 104 may be directed at the substrate 102, at an oblique angle 106. During the initial stages of growth, adatoms may condense onto the substrate 102 and form individual separated islands, or nuclei 108.

Referring to FIG. 1B, due to the oblique angle 106, the adatoms topography may result in geometrical shadowing over regions 110 of the substrate 102. This shadowing may prevent the coalescence of the nuclei 108 into a continuous thin film layer. Instead, the nuclei 108 may capture the vapor flux 104 that would otherwise have landed in the shadowed regions 110 extending their lengths.

Referring to FIG. 1C, the process may result in the formation of columns 112 growing in the direction of the vapor source at a growth angle 107, which may approximate the oblique angle 106 at which the vapor flux 104 was directed at the substrate 102. Between the columns 112 are nanotube voids 114. Thus, the columns 112 may define nanotube structures present within a layer of chalcogenide glass. As explained above, the columns 112 may confine the growth of conductive bridges as described herein.

In an example, thin films of Ge—Se chalcogenide glass were thermally evaporated on a p-type silicon substrate. The crystalline surface structure of the silicon substrate had a (100) configuration. The p-type silicon substrate was first covered with a μm thin film of silicon-oxide (SiO). The evaporation process was conducted using a Cressington 308R desktop coating system. A crucible resembling a semi-Knudsen cell was used for equilibrating the vapor pressure of the source chalcogenide material throughout the chamber.

The film thickness was monitored using 6 MHz quartz crystal resonator. The deposition pressure was $10^{-3}$ mbars with deposition rate of 2 nm s$^{-1}$ and the final film thickness was 500 nm. The substrate temperature was monitored during the deposition process and was kept at room temperature. The Ge—Se films were deposited under various deposition angles (α=90°, 80°, 70°, 60°, 45°, 30°). This was achieved by tilting the wafer holder to the required angle, measured with a goniometer, since the wafer holder had a 360° angle of rotation. Three source compositions for films deposition were used: Ge20Se80, Ge30Se70, and Ge40Se60. These glasses were freshly synthesized from high purity Ge and Se (99,999%) trace metals basis (Aldrich) by melt quenching method.

The oblique angle 106 at which the vapor flux 104 may be applied to the substrate 102 may be used to estimate the growth angle 107 of the columns 112. Typically for growth of this kind a tangent rule may be used to make such a prediction:

$$\tan \alpha = 2 \tan(\beta)$$

where α is the oblique angle 106 and β is the growth angle 107. However, a deviation of approximately 30% was observed in the experimentally grown column angles and the angle estimated by tangent rule. For chalcogenide glass a modified empirical formula may be used, in which a coefficient A is introduced:

$$\tan\alpha = \frac{2}{A}\tan(\beta) = 3.2\tan(\beta)$$

where A is a parameter that depends on the material and deposition rate and is found to be 0.625 for the chalcogenide glass studied in this work. This value for the constant A was obtained by modeling the curve representing the tangent rule to closely resemble the measured angles positions.

Figure 2:
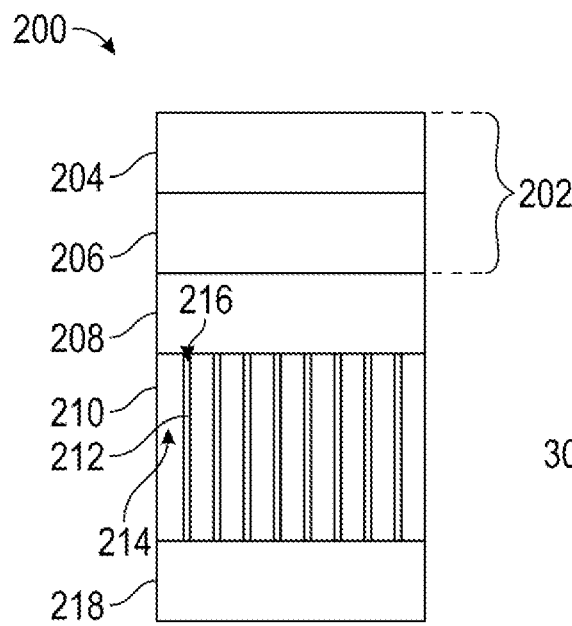
FIG. 2 is a cross-section view of an embodiment of a conductive bridge memory cell in an off-state.

Referring to FIG. 2, an embodiment of a conductive bridge memory cell 200 is depicted. In the case of FIG. 2, the conductive bridge memory cell 200 may be in an off-state. The conductive bridge memory cell 200 may be formed on a substrate 202, which may include a first sublayer 204 and a second sublayer 206. The first sublayer 204 may include a p-type silicon layer. The second sublayer 206 may include a thin silicon-oxide layer.

The conductive bridge memory cell 200 may include an electrochemically active electrode 208 disposed on the substrate 202. The electrochemically active electrode 208 may be an anode and may include a metal such as silver, copper, or a combination thereof. A dielectric layer 210 may be disposed on the electrochemically active electrode 208. The dielectric layer 210 may include a chalcogenide glass. In some embodiments, the chalcogenide glass includes a Ge—Se glass. Nanotube structures 212 may be formed within the dielectric layer 210 as described herein with respect to FIGS.

1A-1C. Within the nanotube structures 212, voids 216 may be present, the voids 216 may lack the dielectric material (e.g. the Ge—Se glass) used to define the dielectric layer 210. For simplicity, in FIG. 2 only the first nanotube structure on the left is labeled. An electrochemically inert electrode 218 may be disposed on the dielectric layer 210 opposite the active electrode 208. The electrochemically active electrode may be a cathode and may include platinum, tungsten, nickel, or a combination thereof. During operation, the electrochemically active electrode 208 may serve as a source of metal ions, which after realization of electrochemical processes may form a conductive bridge filament as described herein. Because the voids 216 within the nanotube structures 212 may omit conditions for growth of the conductive bridge filament, such growth may be confined to columns 214 of dielectric material.

Although the nanotube structures 212 are depicted as passing vertically between the electrochemically active electrode 208 and the electrochemically inert electrode 218, in practice, the nanotube structures 212 may be at any angle relative to the electrodes 208, 218. For example, as described herein, the nanotube structures 212 may be formed at oblique angles through a vapor deposition process.

Figure 3:
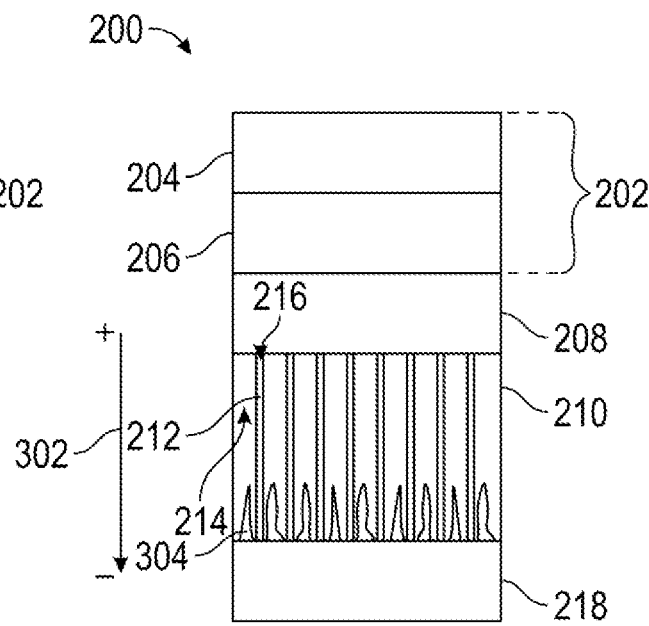
FIG. 3 is a cross-section view of an embodiment of a conductive bridge memory cell in a set-state.

Referring to FIG. 3, the conductive bridge memory cell 200 is depicted in a set state. In this state, an electrical voltage 302 may be applied between the electrochemically active electrode 208 and the electrochemically inert electrode 218. The voltage may trigger oxidation of ions from the electrochemically active electrode 208. The ions may be drawn toward the electrochemically inert electrode 218 and accumulate, forming conductive bridges 304. Growth of the conductive bridges 304 may continue while the electrical voltage 302 is applied.

The electrical voltage 302 may be forward biased. For purposes of this disclosure, a forward bias means that the electrical charge at the electrochemically active electrode 208 is greater than the charge at the electrochemically inert electrode 218 resulting in a voltage potential that draws positively charged ions toward the electrochemically inert electrode 218. The columns 214 may confine growth of the conductive bridges 304 between the nanotube structures 212 within the columns 214. Thus, a benefit of the conductive bridge memory cell 200 is that the three-dimensional growth associated with typical CBRAM devices may be confined and directed in at least one dimension. This more directed approach may enable more efficient device operation and more robust memory cells.

Figure 4:
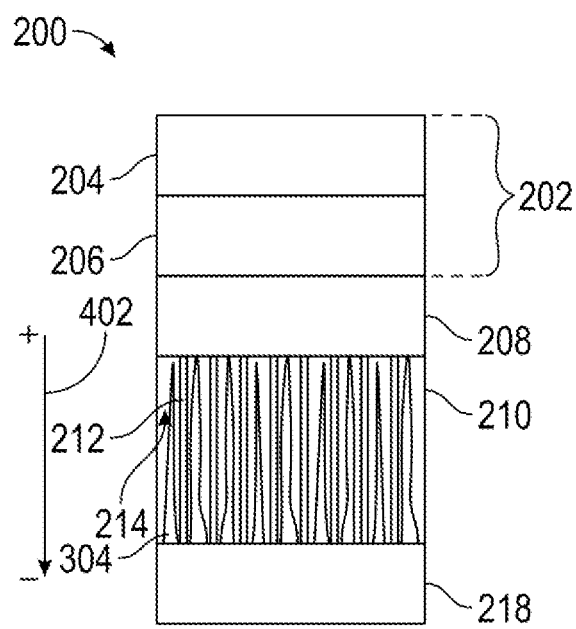
FIG. 4 is a cross-section view of an embodiment of a conductive bridge memory cell in an on-state.

Referring to FIG. 4, the conductive bridges 304 may grow long enough to connect the electrochemically active electrode 208 to the electrochemically inert electrode 218. In this state, the conductive bridge memory cell 200 may be considered as being in an on-state. Although the conductive bridge memory cell is described as on when the conductive bridges 304 connect the electrodes 208, 218 and off when the electrodes 208, 218 are not connected, in some applications the conductive bridge memory cell 200 may be considered as off when the conductive bridges 304 connect the electrodes 208, 218 and on when the electrodes 208, 218 are not connected. A read current 402 may be used to sample the conductive bridge memory cell 200 to determine whether it is in the on state or the off state. The read current 402 may be small enough to avoid any significant changes in the configuration of the conductive bridges 304. Because the electrodes 208, 218 may be connected by the conductive bridges 304, a resistance between the active electrode 208 and the inert electrode 218 may be less when the conductive bridge is present than when the conductive bridge is not present.

Figure 5:
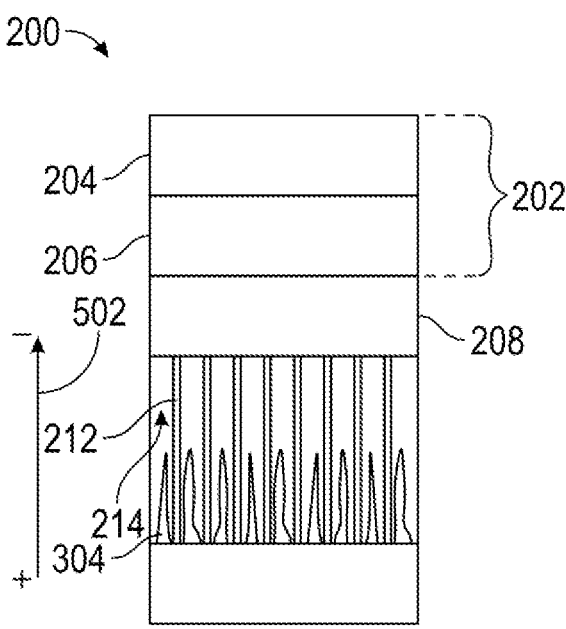
FIG. 5 is a cross-section view of an embodiment of a conductive bridge memory cell in a reset-state.

Referring to FIG. 5, the conductive bridge memory cell 200 is depicted in a reset-state. In this state, a reverse-bias electrical voltage 502 may be applied between the electrochemically active electrode 208 and the electrochemically inert electrode 218. The reverse-bias electrical voltage 402 may draw metallic ions away from the electrochemically inert electrode 218 and dissipate the conductive bridges 304.

As shown in FIGS. 2-5, the forward electrical bias 302 between the active electrode 208 and the inert electrode 218 may result in the formation of the conductive bridges 304 between the active electrode 208 and the inert electrode 218. This may be used to set the conductive bridge memory cell 200 to an on-state. The reverse electrical bias 402 may result in the dissolution of the conductive bridges 304. This may be used to reset the conductive bridge memory cell 200 to an off-state. In an example, a conductive bridge memory cell was formed and had a switching rate below $10^{-4}$ s at voltage of 1.2 volts. This rate may be commensurable with the fastest reported phase change devices. Further, the switching may be performed at lower voltages than phase change devices.

Figure 6:
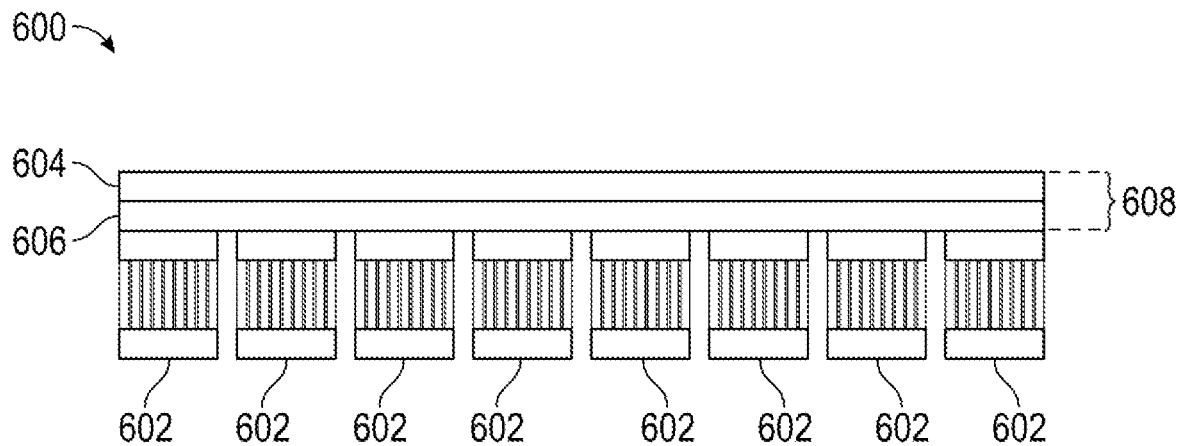
FIG. 6 is a cross-section view of an embodiment of a memory device comprising multiple conductive bridge memory cells.

Referring to FIG. 6, an embodiment of a memory device 600 is depicted. The memory device 600 may include multiple conductive bridge memory cells 602. Each of the conductive bridge memory cells 602 may correspond to the conductive bridge memory cell 200. Thus, as described herein, each of the conductive bridge memory cells 602 may include electrochemically active electrodes, electrochemically inert electrodes, and dielectric layers positioned between the active electrodes and the inert electrodes. By utilizing the on-states and off-states associated with each of the conductive bridge memory cells 602, the memory device 600 may operate to store digital data. Although FIG. 6 depicts eight conductive bridge memory cells 602, in practice memory arrays of differing sizes may be formed. The conductive bridge memory cells 602 may be positioned on a substrate 608, which may include a silicon layer 604 and a silicon-oxide layer 606. Although not depicted in FIG. 6, additional circuitry may be included to join the cells 602 in a way that enables a memory controller (not shown) to set and reset the cells 602.

Figure 7:
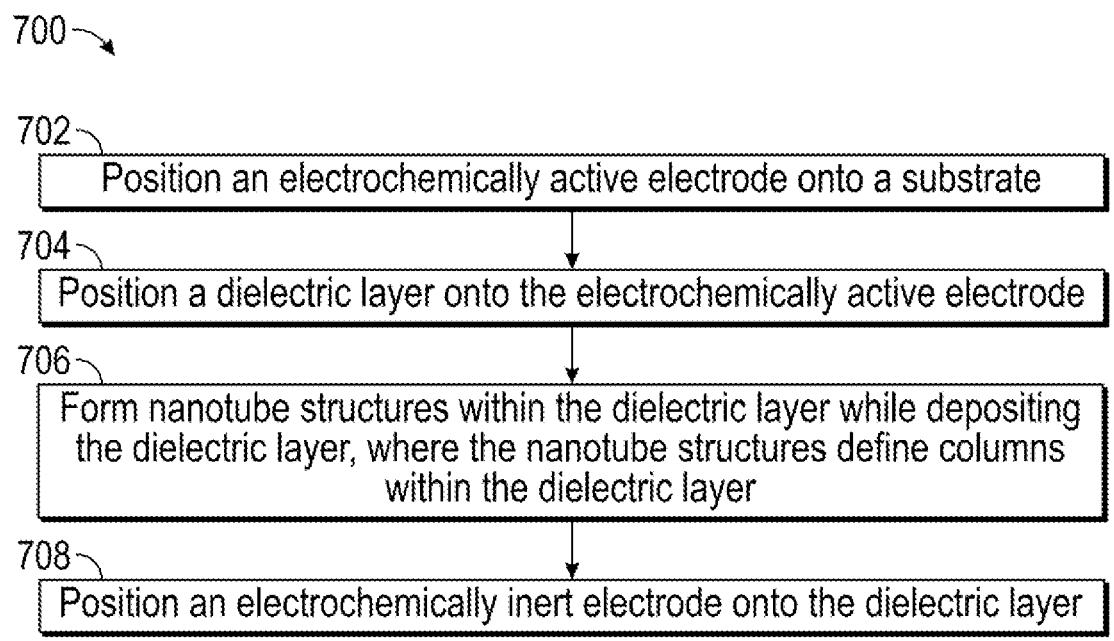
FIG. 7 is a flow chart depicting an embodiment of a method of forming a bridge memory cell.

Referring to FIG. 7, a method 700 of forming a conductive bridge memory cell is depicted. The method 700 may include positioning an electrochemically active electrode onto a substrate, at 702. For example, the electrochemically active electrode 208 may be positioned on the substrate 202.

The method 700 may further include positioning a dielectric layer onto the electrochemically active electrode, at 704. For example, the dielectric layer 210 may be positioned onto the electrochemically active electrode 208.

The method 700 may also include forming nanotube structures within the dielectric layer while positioning the dielectric layer, where the nanotube structures define columns within the dielectric layer, at 706. For example, the nanotube structures 212 may define the columns 214 within the dielectric layer 210.

The method 700 may include positioning an electrochemically inert electrode onto the dielectric layer, at 708. For example, the electrochemically inert electrode 218 may be positioned on the dielectric layer 210.

Although various embodiments have been shown and described, the present disclosure is not so limited and will be understood to include all such modifications and variations as would be apparent to one skilled in the art.

What is claimed is:

1. A conductive bridge memory cell comprising:
   an electrochemically active electrode;
   an electrochemically inert electrode; and
   a chalcogenide glass layer positioned between the electrochemically active electrode and the electrochemically inert electrode, wherein the chalcogenide glass layer includes nanotube structures that define columns of chalcogenide glass separated by spaces, the spaces omitting the chalcogenide glass and omitting dielectric material,
   wherein a forward electrical bias between the electrochemically active electrode and the electrochemically inert electrode causes a formation of a conductive bridge within the columns of chalcogenide glass between the electrochemically active electrode and the electrochemically inert electrode, and wherein a reverse electrical bias causes a dissolution of the conductive bridge.

2. The conductive bridge memory cell of claim 1, wherein the columns confine growth of the conductive bridge between the nanotube structures.

3. The conductive bridge memory cell of claim 1, wherein the electrochemically active electrode includes an anode comprising silver, copper, or a combination thereof.

4. The conductive bridge memory cell of claim 1, wherein the electrochemically inert electrode includes a cathode comprising platinum, tungsten, nickel, or a combination thereof.

5. The conductive bridge memory cell of claim 1, wherein the chalcogenide glass includes a Ge—Se glass.

6. The conductive bridge memory cell of claim 5, wherein the Ge—Se glass includes $Ge_{20}Se_{80}$, $Ge_{30}Se_{70}$, or $Ge_{40}Se_{60}$.

7. The conductive bridge memory cell of claim 1, wherein a resistance between the electrochemically active electrode and the electrochemically inert electrode is less when the conductive bridge is present than when the conductive bridge is not present.

8. A memory device comprising multiple conductive bridge memory cells, wherein each conductive bridge memory cell comprises:
   an electrochemically active electrode;
   an electrochemically inert electrode; and
   a chalcogenide glass layer positioned between the electrochemically active electrode and the electrochemically inert electrode, wherein the chalcogenide glass layer includes nanotube structures that define columns of chalcogenide glass separated by spaces, the spaces omitting the chalcogenide glass and omitting dielectric material, wherein a forward electrical bias between the electrochemically active electrode and the electrochemically inert electrode results in a formation of a conductive bridge, within the chalcogenide glass layer, between the electrochemically active electrode and the electrochemically inert electrode, and wherein a reverse electrical bias results in a dissolution of the conductive bridge.

9. The memory device of claim 8, wherein the electrochemically active electrode includes an anode comprising silver, copper, or a combination thereof.

10. The memory device of claim 8, wherein the electrochemically inert electrode includes a cathode comprising platinum, tungsten, nickel, or a combination thereof.

11. The memory device of claim 8, wherein the chalcogenide glass includes a Ge—Se.

12. The memory device of claim 11, wherein the Ge—Se includes $Ge_{20}Se_{80}$, $Ge_{30}Se_{70}$, or $Ge_{40}Se_{60}$.

* * * * *